(12) United States Patent
Rättig et al.

(10) Patent No.: US 12,020,829 B2
(45) Date of Patent: Jun. 25, 2024

(54) CLAD WIRE AND METHOD FOR PRODUCING CLAD WIRES

(71) Applicant: Heraeus Deutschland GmbH & Co. KG, Hanau (DE)

(72) Inventors: Marc Rättig, Hanau (DE); Thilo Birnbaum, Hanau (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 71 days.

(21) Appl. No.: 17/248,602

(22) Filed: Jan. 29, 2021

(65) Prior Publication Data

US 2021/0241935 A1  Aug. 5, 2021

(30) Foreign Application Priority Data

Feb. 4, 2020 (EP) ..................................... 20155340

(51) Int. Cl.
*H01B 1/02* (2006.01)
*G01R 1/067* (2006.01)
(Continued)

(52) U.S. Cl.
CPC ............ *H01B 1/02* (2013.01); *G01R 1/06755* (2013.01); *G01R 1/073* (2013.01); *G01R 3/00* (2013.01);
(Continued)

(58) Field of Classification Search
CPC . H01B 1/02; H01B 5/00; H01B 13/22; H01B 7/0009; H01B 7/188; H01B 7/20;
(Continued)

(56) References Cited

U.S. PATENT DOCUMENTS

| 9,297,833 B2 | 3/2016 | Obata |
| 2006/0197542 A1 | 9/2006 | Tanaka |
(Continued)

FOREIGN PATENT DOCUMENTS

| CN | 113223754 A | 8/2021 |
| EP | 2060921 A1 | 5/2009 |
(Continued)

OTHER PUBLICATIONS

European Search Report issued in EP20155340 dated Jul. 6, 2020.

*Primary Examiner* — Lee E Rodak
(74) *Attorney, Agent, or Firm* — Blank Rome LLP

(57) ABSTRACT

A clad wire for producing test needles or sliding contacts is provided herein, the clad wire having a wire core made of rhodium or a rhodium-based alloy, an inner cladding made of copper or silver or aluminum or a copper-based alloy or a silver-based alloy or an aluminum-based alloy, wherein the inner cladding covers or completely encloses the wire core on at least two opposite sides, an adhesion-promoting layer made of gold or a gold-based alloy, which is arranged between the wire core and the inner cladding, and an outer cladding made of a metal or a metal alloy having a greater hardness than the inner cladding, wherein the outer cladding encloses the inner cladding. A method for producing a clad wire and to a test needle having at least one clad wire or produced from a clad wire and a test needle array is also provided herein.

19 Claims, 13 Drawing Sheets

Figure 1:
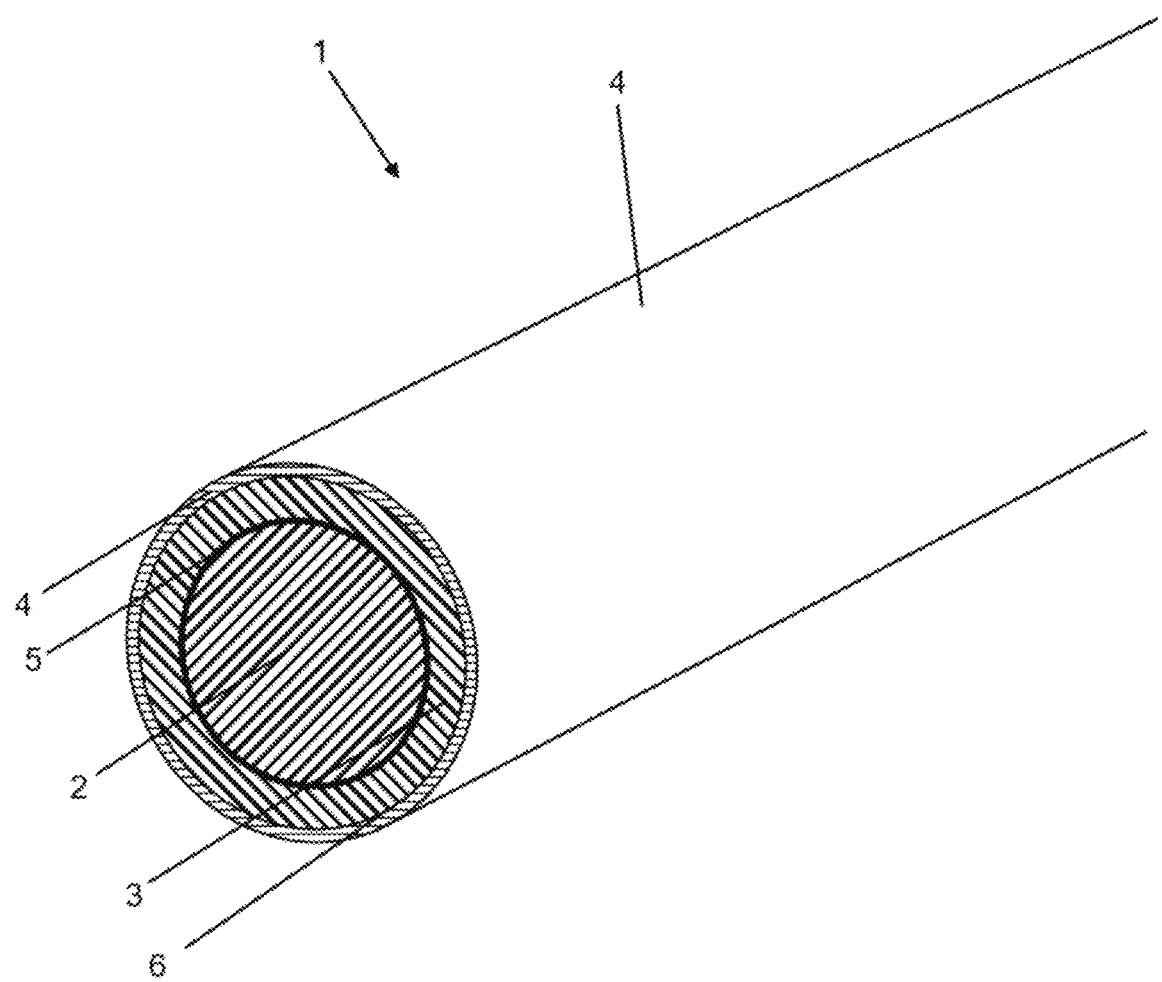

(51) Int. Cl.
  *G01R 1/073*   (2006.01)
  *G01R 3/00*    (2006.01)
  *H01B 5/00*    (2006.01)
  *H01B 13/22*   (2006.01)
(52) U.S. Cl.
  CPC ............... *H01B 5/00* (2013.01); *H01B 13/22* (2013.01); *G01R 1/06711* (2013.01); *G01R 1/07314* (2013.01); *G01R 1/07342* (2013.01)
(58) Field of Classification Search
  CPC .. H01B 7/205; H01B 13/222; G01R 1/06755; G01R 1/073; G01R 3/00; G01R 1/06711; G01R 1/07314; G01R 1/07342; G01R 1/06733; G01R 1/06761
  See application file for complete search history.

(56) References Cited

U.S. PATENT DOCUMENTS

| | | | |
|---|---|---|---|
| 2008/0280542 A1* | 11/2008 | Miyagi | B24B 19/226 451/64 |
| 2008/0308395 A1* | 12/2008 | Murakami | H01H 1/02 200/268 |
| 2010/0194415 A1 | 8/2010 | Wajata | |
| 2010/0239453 A1 | 9/2010 | Obata | |
| 2012/0071037 A1 | 3/2012 | Balucani et al. | |
| 2012/0286816 A1 | 11/2012 | Kister | |
| 2013/0099813 A1 | 4/2013 | Hoshino et al. | |
| 2014/0176172 A1* | 6/2014 | Stevenson | G01R 31/2886 156/48 |
| 2014/0266278 A1 | 9/2014 | Yeh | |
| 2016/0252547 A1* | 9/2016 | Soerensen | H01R 43/20 324/755.03 |
| 2017/0122980 A1 | 5/2017 | Crippa et al. | |
| 2017/0307657 A1 | 10/2017 | Crippa | |
| 2019/0101569 A1 | 4/2019 | Albertson et al. | |

FOREIGN PATENT DOCUMENTS

| | | | | |
|---|---|---|---|---|
| EP | 2248920 A1 | | 11/2010 | |
| EP | 2662465 A1 | | 11/2013 | |
| JP | H1021772 A | | 1/1998 | |
| JP | H11273818 A | | 10/1999 | |
| JP | 2012163460 A | | 8/2012 | |
| KR | 20180057520 A | * | 5/2018 | |
| WO | WO-9638858 A2 | | 12/1996 | |
| WO | WO-2016009293 A1 | | 1/2016 | |
| WO | WO-2016107729 A1 | * | 7/2016 | ......... G01R 1/06716 |
| WO | 2018093109 A2 | | 5/2018 | |

\* cited by examiner

CLAD WIRE AND METHOD FOR PRODUCING CLAD WIRES

CROSS REFERENCE TO RELATED APPLICATION

This application claims the benefit of Europe Application No. 20155340.1 filed Feb. 4, 2020, the entire contents of which are incorporated by reference herein.

The invention relates to a clad wire for producing test needles for testing the contacting of terminal pads or for producing sliding contacts such as multi-wire sliders and tuft brushes.

The invention also relates to a test needle and a sliding contact having at least one such clad wire and to a method for producing such a clad wire.

Clad wires combine the properties of different materials and can therefore be used beneficially in different fields. For example, clad wires can be used as test needles for testing the electrical contacting of terminals in microelectronics or as sliding wires for producing electrical sliding contacts.

During chip production, wafers are contacted with test needles directly after processing in order to test the operability of integrated circuits (IC) in the unsawn state. An array of test needles tests the semiconductor wafer for functionality after the structuring of the individual chips. The test needles are fixed in a probe card which is matched to the design of the wafer. In the test process, the wafer is pressed onto the test needles and contact is established between test needles and the pads of the ICs, and in the case of aluminum pads is established through a passivation layer. Various parameters are then tested, such as the contacting, the electrical characteristic values at high current density and the electrical behavior during temperature changes.

Test needles are thus used in the production of power electronics, the contacting of chips and other electrical circuits for testing the quality of electrical contacts (see, for example, US 2014/0266278 A1 and US 2010/0194415 A1).

The key parameters of a good test needle are a high electrical conductivity since in this case high electrical currents have to be transmitted, a suitable modulus of elasticity ($m_E$) and a high yield strength ($Rp_{0.2}$), which produce good resilient properties. A high thermal conductivity brings about a good dissipation of thermal energy and thus the smallest possible additional thermal increase in electrical resistance. Suitable hardness, modulus of elasticity and yield strength are required, on the one hand, to keep maintenance intervals short and, on the other hand, to achieve good resilient properties of the test needle.

Test needles made of the materials tungsten, tungsten carbide, palladium-copper-silver alloys and tungsten-rhenium are widely used for testing on aluminum pads. These are particularly hard, with aluminum pads being more robust than gold pads and being able to withstand a test with hard needles better than gold pads.

For application on gold pads, Pd alloys are known, such as, for example, Paliney® H3C from Deringer Ney or NewTec® from Advanced Probing. In addition, PtNi30 alloys exist on the market for test needles. US 2010/0239453 A1 and EP 2 248 920 A1 disclose low-doped iridium alloys for producing test needles.

US 2006/0197542 A1 discloses an iridium-based alloy and a platinum-based alloy for producing test needles. The alloys have a high hardness of between 300 HV and 500 HV in order to be able to establish good contact through a paint layer arranged on the gold pads.

Iridium has the disadvantage that it has a lower thermal conductivity and electrical conductivity than other metals.

A disadvantage of these alloys is that the tips have to be ground, which is a more expensive and often manually performed process.

Furthermore, test structures can be produced to a small extent with microsystem technology. The high production costs are disadvantageous in this case.

Currently, metals or alloys which have a high electrical and thermal conductivity but also high hardnesses and tensile strengths are used for so-called probe needles (test needles). The electrical conductivity of pure copper (100% IACS) is used as a reference. However, copper (Cu) and silver (Ag) cannot be used for these purposes since they are far too ductile and the test needle would deform during use. Typical materials for test needles are precipitation-hardened palladium-silver alloys which contain 10% gold and 10% platinum and are sold, for example, under the product names Paliney® 7 and Hera 648. However, PtNi alloys (platinum-nickel alloys) or rhodium (Rh) are also used as materials for foils to produce test needles. For such metals or alloys which are as good a compromise as possible between electrical conductivity, thermal conductivity, tensile strength and hardness, the maximum possible electrical conductivity is 5% to 30% IACS.

Typical materials for probing applications include rhodium and its alloys. However, since rhodium in pure form has a relatively high modulus of elasticity (about 370 GPa), it is only usable to a limited extent. This limitation has the effect that test needles made of these materials are only usable with the thinnest diameters and extremely lengthened test needles in order to compensate for the modulus of elasticity or the resulting necessary mechanical force and stress. However, the longer needle has the consequence that the electrical resistance of the test needle significantly increases, which is disadvantageous. At the same time, rhodium and its alloys in any case usually have only low electrical conductivities of only about 30% IACS. Furthermore, the heat dissipation is impaired by a thin and long test needle.

In addition to test needles, however, other applications, such as in particular wires for sliding contacts, of materials with high electrical and thermal conductivities and simultaneously good mechanical properties, such as high hardness and tensile strength, also benefit. In the case of sliding contacts, it is important that, on the one hand, a low contact resistance is caused by the surfaces and, on the other hand, the material does not wear, i.e., abrade, or erode too quickly.

In addition to a high electrical conductivity, applications such as test needles (probe needles) or sliding wires in power electronics also require high mechanical strength and hardness. In this case, the temperature resistance or the heat resistance is also crucial.

WO 2016/009293 A1 proposes a test needle wherein a tip is arranged on the front side of the test needle, which tip consists of a mechanically hard first material and the remainder of the test needle consists of a second material having a high electrical conductivity. Similar test needles are also known from US 2013/0099813 A1, EP 2 060 921 A1 and US 2012/0286816 A1. US 2019/0101569 A1 proposes a clad wire having such a tip, with the tip being fastened only to the wire core of the clad wire. The clad wire is intended to have a wire core with a single coating. The disadvantage of this is that the test needle no longer has homogeneous physical properties over its length, and that the electrical and thermal conductivity as well as the tensile strength depend very heavily on the bond between the two materials. In addition, a low electrical conductivity in one region cannot easily be compensated for by a high electrical conductivity in another region since the current must pass through both regions, as in the case of series connections of electrical resistors.

As composite wires for producing test needles or sliding wires, wires which are coated all round can be used, for example, which can be produced as so-called clad wires or double wires by continuous rolling processes or with the aid of galvanic coatings. For example, these can have a base metal, for example comprising a Cu alloy such as $CuBe_2$ in the interior, clad with a noble metal alloy (for example Hera238) in order to be able to be used for contact applications in sliding contacts in slip ring transmitters or also switching contacts in microswitches, as is described in the not previously published DE 10 2019 130 522.5.

It is therefore the object of the invention to overcome the disadvantages of the prior art. In particular, materials and a method for producing such materials are to be found with which test needles are producible that have a greater thermal conductivity and electrical conductivity and, at the same time, have the mechanical properties suitable for test needles with respect to the modulus of elasticity and resilient properties.

Furthermore, the materials should have a sufficiently high hardness in order to guarantee as long a service life as possible and only little or no damage to the pads. At the same time, the materials should have sufficient elasticity so that the test needles do not deform plastically during contacting and in order to keep the tolerances as large as possible during the production of probe cards with such test needles.

A further object of the invention is to provide a test needle which satisfies the aforementioned properties. Furthermore, the invention addresses a further problem of developing a sliding contact comprising a plurality of wires made of such a material.

The objects of the invention are achieved by a clad wire for producing test needles or sliding contacts, comprising
1. a wire core made of rhodium or a rhodium-based alloy,
2. an inner cladding made of aluminum or copper or silver or a copper-based alloy or a silver-based alloy or an aluminum-based alloy, wherein the inner cladding covers the wire core on at least two opposite sides or completely encloses the wire core,
3. an adhesion-promoting layer of gold or a gold-based alloy, which is arranged between the wire core and the inner cladding, and
4. an outer cladding made of a metal or a metal alloy with a greater hardness than the material of the inner cladding, wherein the outer cladding encloses the inner cladding.

A base alloy is understood as meaning an alloy in which the alloy contains a proportion of at least 50 at % of the stated element.

A cladding is understood as meaning a layer or a coating which surrounds a part of the clad wire lying further inwards.

It can be provided that the inner cladding completely encloses the wire core and/or that the outer cladding completely encloses the inner cladding.

The outer cladding preferably forms the outer surface of the clad wire.

A wire core is understood as meaning the innermost, axially extending part of the clad wire.

The rhodium-based alloy used is preferably a rhodium alloy having 0.01 wt % to 30 wt % of zirconium and not more than 1 wt % of other elements (impurities) or a rhodium alloy Hera5270. Particularly preferably, an alloy is used as described in EP 2 662 465 B1 or an RhZr0.2 alloy having 0.2 wt % of zirconium and the remainder being rhodium including production-related impurities.

The gold-based alloy for the adhesion-promoting layer preferably contains at least 90 at % gold.

The copper-based alloy is preferably a copper-silver alloy or a copper-gold alloy or a copper-aluminum alloy with at least 50 at % copper and common impurities or a copper-based alloy containing at least 50 at % copper and at least two of the metals silver, gold, aluminum and common impurities.

The silver-based alloy is preferably a silver-copper alloy or a silver-gold alloy or a silver-aluminum alloy having at least 50 at % silver and common impurities or a silver-based alloy containing at least 50 at % silver and at least two of the metals copper, gold, aluminum and common impurities.

According to the invention, it can preferably be provided that the clad wire is a multilayer composite wire.

Particularly preferably, the wire core (except for common impurities) consists of a rhodium-based alloy having 0.1 wt % to 30 wt % of zirconium (very particularly preferably with 0.2 wt % of zirconium), the adhesion-promoting layer consists of gold (except for common impurities), the inner cladding consists of copper, silver or aluminum (except for common impurities, wherein copper is very particularly preferred) and the outer cladding consists of a palladium-nickel alloy, rhodium, a rhodium-zirconium alloy, a copper-tin-zinc alloy or a gold-based alloy (except for common impurities), wherein preferably the gold-based alloy (except for common impurities) is a gold-cobalt alloy, a gold-iron alloy or a gold-nickel alloy.

In the case of clad wires according to the invention, it can be provided that the volume of the wire core is at least as large as the volume of the inner cladding, preferably the volume of the wire core is as large as the volume of the inner cladding or up to 20 times greater than the volume of the inner cladding.

In the case of clad wires according to the invention, it can also be provided that the wire core and the inner cladding have a thickness or layer thickness at least which is twice as large as the adhesion-promoting layer, in particular a thickness or layer thickness which is at least three times as great as the adhesion-promoting layer.

By means of these two measures, it is achieved that the essential mechanical and the electrical properties of the clad wire are defined primarily by the wire core and the inner cladding and their volume ratio.

Furthermore, it can be provided that a diffusion protection layer is arranged as a diffusion barrier between the inner cladding and the outer cladding, the diffusion protection layer preferably consisting of nickel or gold or a nickel-based alloy or a gold-based alloy.

As a result, it is achieved that in particular the electrical properties of the inner cladding are not impaired by inward diffusion of atoms or ions out of the outer cladding. In particular, the electrical conductivity of the inner cladding is not to be reduced as a result. In particular, this prevents deterioration of the electrical conductivity over time, when the clad wire is used, by the inward diffusion of foreign atoms into the inner cladding.

In this case, it can be provided that the inner cladding has at least a layer thickness twice as large as the diffusion protection layer, preferably the inner cladding has at least a layer thickness which is three times as great as the diffusion protection layer. This is intended to ensure that the diffusion protection layer does not influence the mechanical properties and electrical properties of the clad wire itself too strongly, compared with the inner cladding.

According to a preferred development of the present invention, it can be provided that the outer cladding consists of rhodium, a rhodium-based alloy, a copper-tin-zinc alloy, a palladium-nickel alloy or a gold-based alloy, wherein the gold-based alloy preferably is a gold-cobalt alloy, a gold-iron alloy or a gold-nickel alloy.

These materials and alloys are hard and are thus able to be used particularly well as abrasive protective layers. It is preferred that the outer cladding consists of a palladium-nickel alloy.

It can also be provided that the clad wire at room temperature has a modulus of elasticity (elastic modulus or $m_E$, for short) of at least 150 GPa, preferably of at least 200 GPa, particularly preferably of 215 GPa, and/or
the clad wire at room temperature has a 0.2% offset yield strength $Rp_{0.2}$ (elasticity limit) of at least 1800 MPa, preferably of at least 2000 MPa, particularly preferably of 2150 MPa, and/or
the clad wire at room temperature has an electrical conductivity of at least 40% IACS, preferably of at least 50% IACS, particularly preferably of 57% IACS.

These mechanical and electrical properties and in particular the combination thereof ensure that the clad wire has particularly good elastic properties and a high electrical conductivity so that said clad wire can be used as a test needle or sliding contact.

The modulus of elasticity $m_E$, the 0.2% offset yield strength $Rp_{0.2}$ and the tensile strength $R_m$ are determined by means of a Zwick Z250 tensile testing machine. The tensile test was carried out on a clad wire with a wire diameter of 55 μm and relates thereto. The test speed with respect to the modulus of elasticity $m_E$ and the yield strength $Rp_{0.2}$ was 1 mm/min, while the test speed for the tensile strength $R_m$ was 10 mm/min.

The electrical conductivity was determined with a 4-pole measurement of the voltage drop across the test specimen for a defined length with a Burster Resistomat 2316. The measurement is carried out using a clad wire with a wire length of between 0.06 m and 0.07 m, a diameter of 52 μm and a measurement current of 10 mA.

Furthermore, it can be provided that the clad wire has a diameter or a thickness of at most 200 μm, preferably has a diameter or a thickness of between 10 μm and 100 μm, very particularly preferably has a diameter or a thickness of between 20 μm and 70 μm.

Clad wires with these diameters or flat clad wires with these thicknesses are particularly well usable as test needles and as sliding wires.

Furthermore, it can be provided that the wire core has a diameter or a thickness of between 9 μm and 100 μm, preferably between 20 μm and 70 μm, very particularly preferably has a diameter or a thickness of between 30 μm and 60 μm, and/or
the inner cladding has a layer thickness of between 1 μm and 20 μm, preferably between 5 μm and 15 μm, and/or
the outer cladding has a layer thickness of between 0.5 μm and 5 μm, preferably between 1 μm and 3 μm, and/or
the adhesion-promoting layer has a layer thickness of between 100 nm and 1000 nm, preferably between 300 nm and 600 nm.

With these material thicknesses, it is achieved that the wire core and the respective layers provide the desired contributions to the mechanical and electrical properties of the clad wire.

It can also be provided that the adhesion-promoting layer, the inner cladding, the outer cladding and optionally the diffusion protection layer are galvanic coatings.

This enables a cost-effective coating. In addition, it can be ensured in this way that complete coating occurs.

If the inner cladding consists of aluminum or an aluminum-based alloy, it can preferably be applied to the wire core by means of a physical vacuum deposition method such as physical vapor deposition (PVD).

According to a preferred embodiment, it can be provided that the wire core is work-hardened.

A work-hardened material is understood as meaning a material which has been hardened against further deformations by mechanical forming. Since the dislocation density increases as a result of plastic deformation (up to $10^{12}$ m$^{-2}$), the probability increases that dislocations mutually impede each other in their movement. Therefore, a greater stress is necessary for further deformation, which becomes noticeable in an increase in yield strength and strength. This behavior is referred to as work hardening. Advantage is taken of this effect according to the invention in order to increase the strength of the wire core by low pre-deformation, for example by rolling or drawing.

The mechanical properties, in particular the resilient properties of the clad wire, are thereby improved.

Furthermore, it can be provided that the wire core has a rectangular cross section. It can preferably be provided that the clad wire is produced from a strip of the wire core, particularly preferably the clad wire is produced from a strip of the wire core coated with the inner cladding and the adhesion-promoting layer.

The clad wire can thus also be a clad wire with a rectangular cross section. The clad wire can then be referred to as a flat wire.

Alternatively, the wire core can be an ordinary wire with a round, in particular circular, cross section. The clad wire then also has a round, in particular circular, cross section. Deviations from the ideal circular symmetry of up to 20% with respect to the diameter can occur, in particular with small diameters of less than 80 μm.

In contrast to a wire, the strip-like wire core has a rectangular cross section, with it being possible for the corners to be rounded. The width of the strip-like wire core of the clad wire is preferably at least twice as large as the thickness. In this case also, deviations of up to 20% within the strip-like clad wire are possible.

The problems addressed by the present invention are also solved by a method for producing a clad wire, characterized by the following chronological steps:
A) providing a wire core made of rhodium or a rhodium-based alloy,
B) coating the wire core with an adhesion-promoting layer made of gold or a gold-based alloy,
C) coating the wire core, coated with the adhesion-promoting layer, with an inner cladding of copper or silver or aluminum or a copper-based alloy or a silver-based alloy or an aluminum-based alloy, and
D) coating the wire core, coated with the adhesion-promoting layer and the inner cladding, with an outer cladding made of a metal or a metal alloy having a greater hardness than the material of the inner cladding.

The clad wire produced by this method has the same advantages as the clad wire according to the invention.

In this case, it can preferably be provided that a clad wire according to the invention is produced by means of the method.

In the method according to the invention, it can also be provided that the wire core is strip-like and a step C1) takes place between steps C) and D):

C1) cutting the coated strip-like wire core perpendicular to a longitudinal axis of the strip into a plurality of coated wire cores, in which the wire cores are coated on two opposite sides by the adhesion-promoting layer and the inner cladding, and wherein in step D) each of the coated wire cores is coated with the outer cladding.

As a result, a clad wire according to the invention can be constructed from a strip-like wire core as an intermediate product.

In the method according to the invention, it can also be provided that a step C2) takes place between steps C) and D):

C2) coating the wire core, coated with the adhesion-promoting layer and the inner cladding, with a diffusion protection layer, preferably with a diffusion protection layer made of nickel or gold or a nickel-based alloy or a gold-based alloy, and wherein in step D) the wire core, coated with the adhesion-promoting layer, the inner cladding and the diffusion protection layer, is coated with the outer cladding.

As a result, it is achieved that in particular the electrical properties of the inner cladding are not impaired by inward diffusion of atoms or ions out of the outer cladding. In particular, the electrical conductivity of the inner cladding is not to be reduced as a result.

Furthermore, it can be provided that the coatings according to steps B), C) and D) and optionally C2) are applied using a galvanic method and/or are applied using a physical vacuum deposition method, in particular using physical vapor deposition (PVD).

This enables a cost-effective coating. In addition, it can be ensured in this way that complete coating occurs. The coating with aluminum or the aluminum-based alloy is preferably carried out using physical vapor deposition (PVD). All other coatings are preferably carried out using galvanic methods.

According to the invention, the wire core is work-hardened before step A), preferably work-hardened by mechanical forming, particularly preferably work-hardened by rolling and drawing.

The problems addressed by the present invention are also solved by a test needle comprising at least one clad wire according to the invention or comprising a clad wire which has been produced by means of a method according to the invention, wherein preferably the test needle is bent perpendicular to the cylinder axis of the clad wire or perpendicular to a longitudinal axis of the clad wire.

The problems addressed by the present invention are further solved by a test needle array comprising a plurality of such test needles spaced apart from one another.

The problems addressed by the present invention are further solved by a sliding contact comprising a plurality of clad wires according to the invention or comprising a clad wire which has been produced by means of a method according to the invention, wherein preferably the clad wires form a wire bundle.

The invention is based on the surprising discovery that with a clad wire comprising an inner wire core made of rhodium or a rhodium-based alloy and a highly conductive inner cladding made of copper or silver as well as a hard outer cladding it is possible to provide a clad wire which has the high electrical conductivity of copper, silver or the base alloys thereof and, at the same time, provides the preferred mechanical elastic properties through the wire core and the outer cladding. As a result, the clad wire is well usable both as a test needle and for producing sliding contacts.

The adhesion-promoting layer is used for the more stable bonding of the inner cladding to the wire core in the case of elastic deformation of the clad wire. This leads to an improved service life by preventing local detachment of the material of the inner cladding from the material of the wire core as a result of load-bending changes.

The optionally present diffusion protection layer is used in order not to impair the electrical conductivity of the inner cladding. A plurality of diffusion barriers made of different materials can also be used as the diffusion protection layer. This also results in an improved service life since undesired alloying of the material of the inner cladding is prevented, which would result in a reduction in the electrical conductivity.

The material of the wire core is particularly tension-resistant when RhZr0.2 or another rhodium-based alloy containing zirconium with up to 30 at % zirconium is used (3000 MPa compared to 1500 MPa with pure rhodium) and can be particularly finely drawn as a result of the zirconium. The high tensile strength allows relatively thick copper layers or silver layers to be applied as an inner cladding, which results in a significant increase in conductivity. Furthermore, pure rhodium becomes brittle at approximately 100 µm to 80 µm and breaks, which is why current commercially available needle diameters of about 50 µm made from pure rhodium are not usable for this purpose.

Electrical conductivities of about 60% IACS or even more are possible with the present invention. Furthermore, the resulting overall modulus of elasticity of the multilayer structure is significantly reduced, which results in a significant improvement in the resilient properties, which is expressed in an increase in the quotient $Rp_{0.2}/m_E$.

The present invention provides a material which, on the one hand, drastically lowers the overall modulus of elasticity $m_E$ of the clad wire, in particular of the multilayer composite wire, with a simultaneously high yield strength $Rp_{0.2}$ and, on the other hand, greatly increases the electrical conductivity. For this purpose, a wire core made of rhodium and a rhodium alloy such as Hera5270 is used and the latter is galvanically coated with various functional layers.

In order to be able to use the soft copper or the soft silver and thus to be able to use the high electrical conductivity thereof for the clad wire, it is important to arrange a harder enveloping layer in the form of the outer cladding around the inner cladding.

Figure 2:
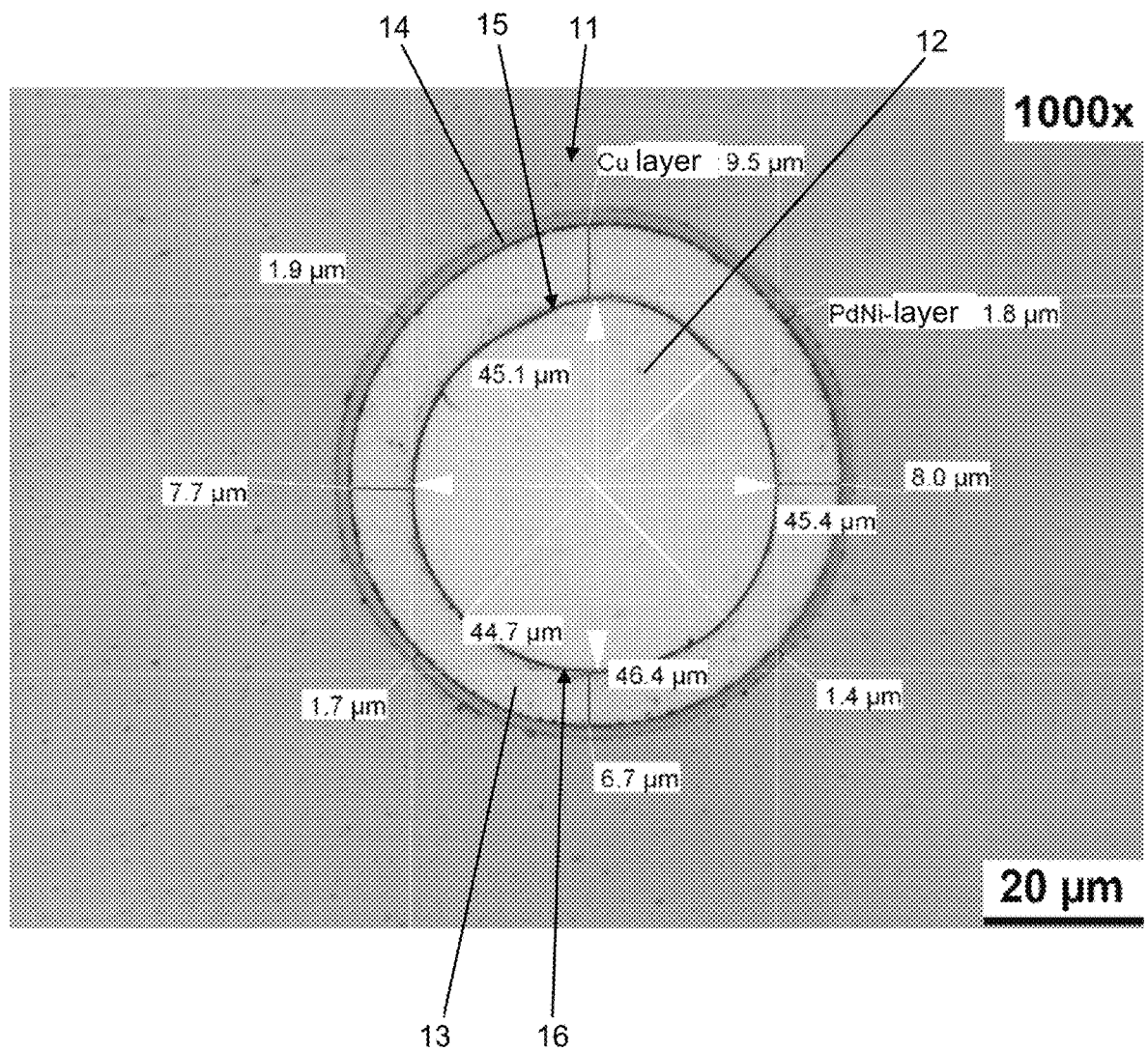
Figure 3:
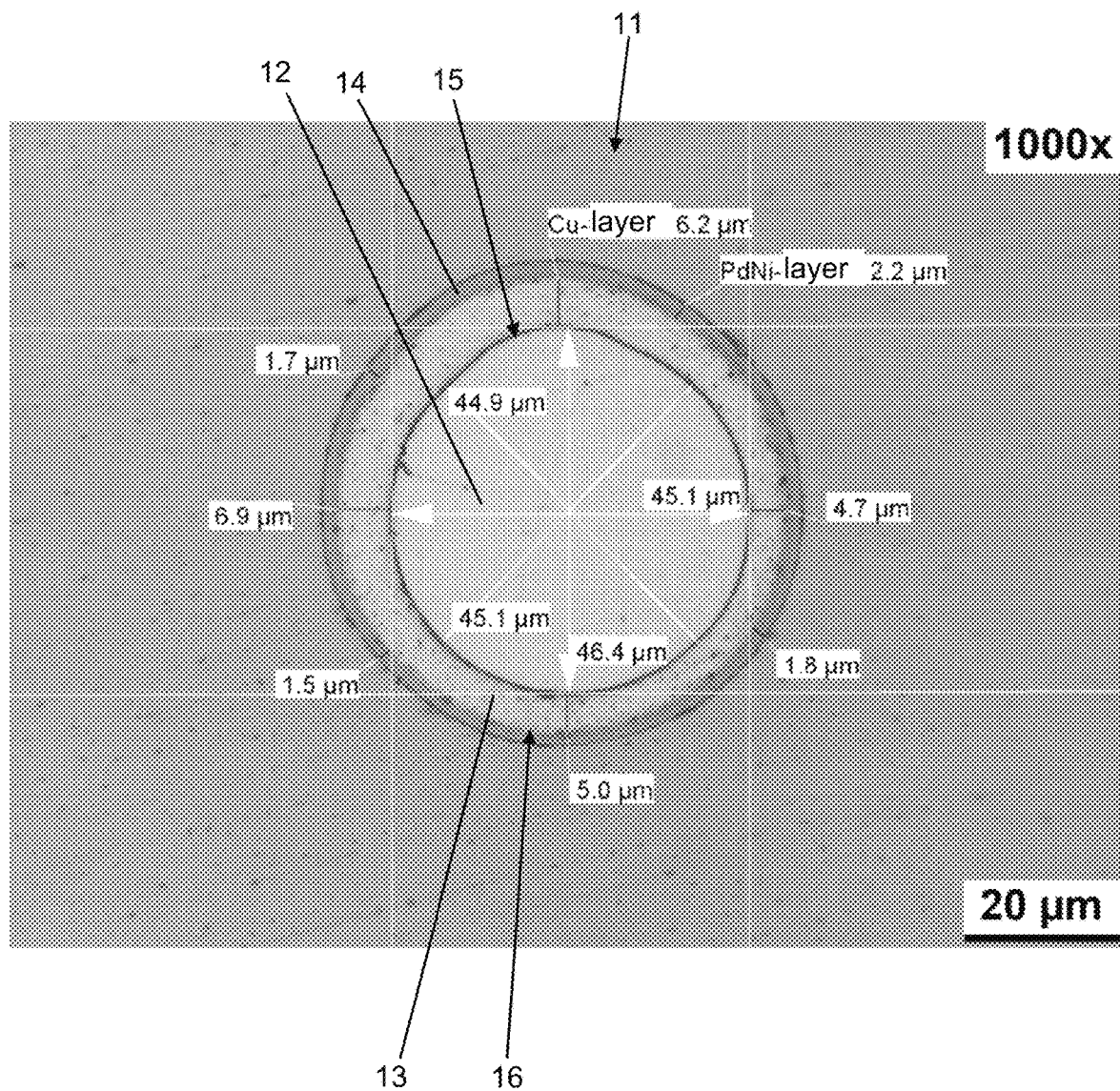
Figure 4:
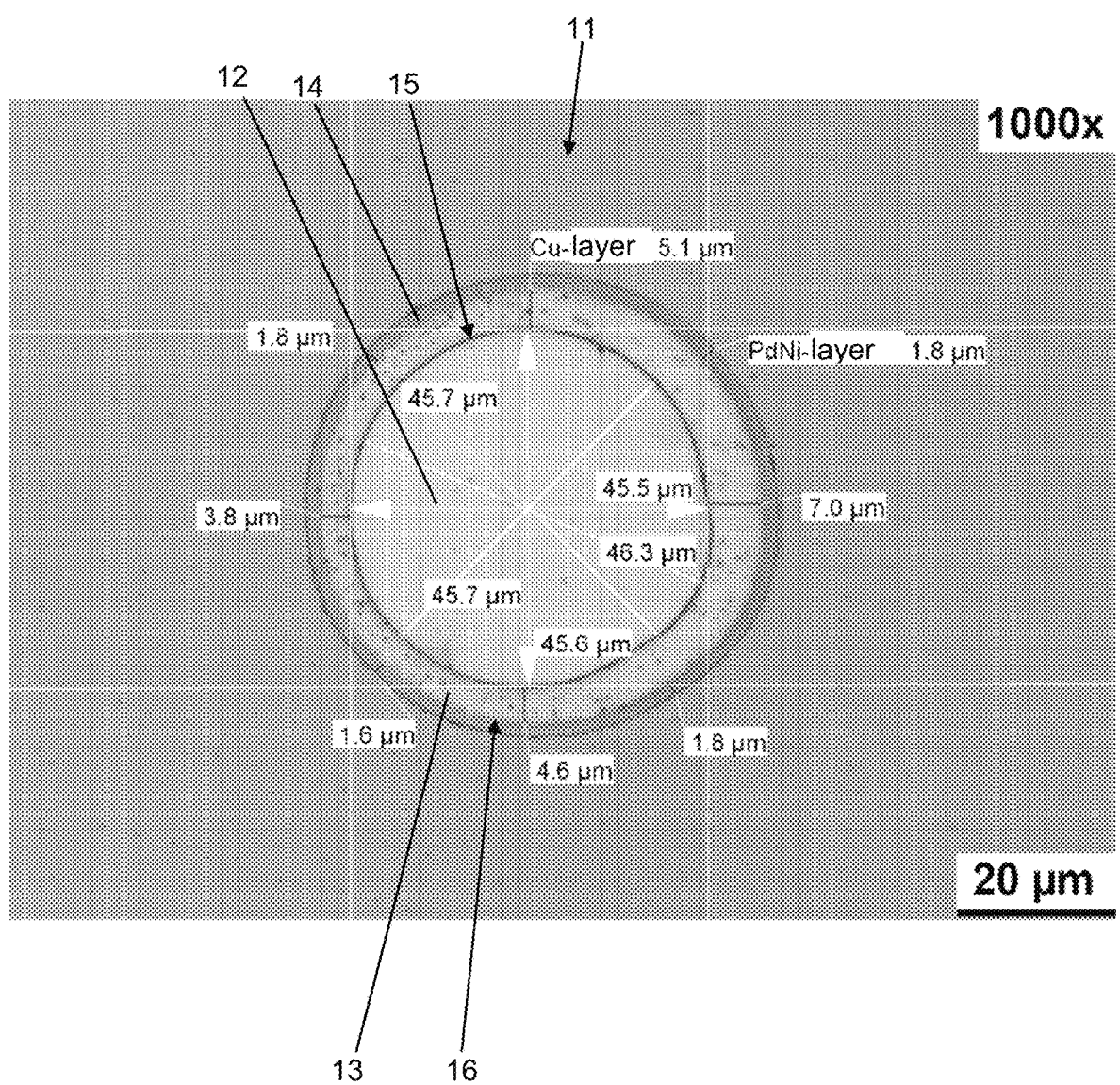
Figure 5:
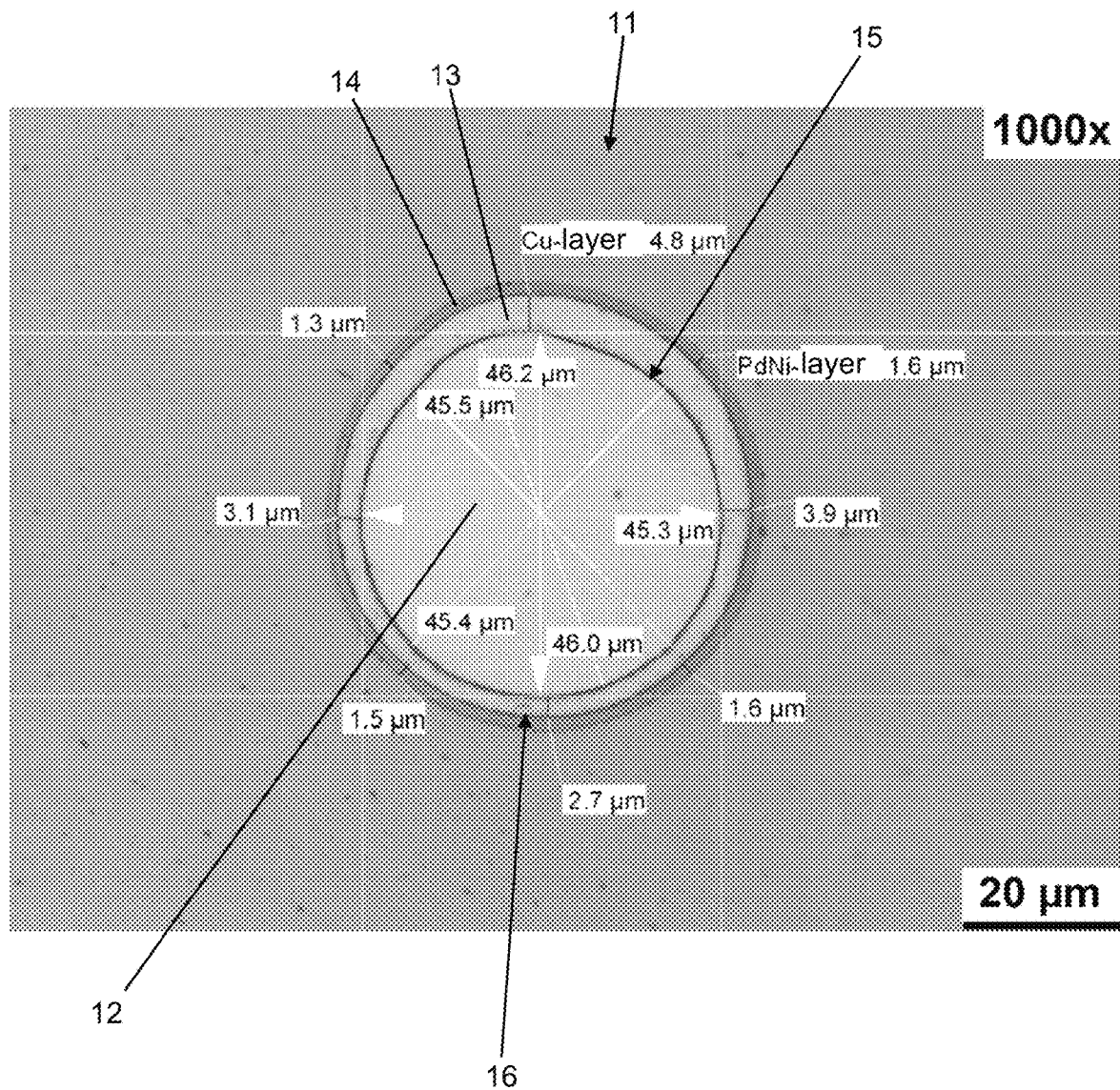
Figure 6:
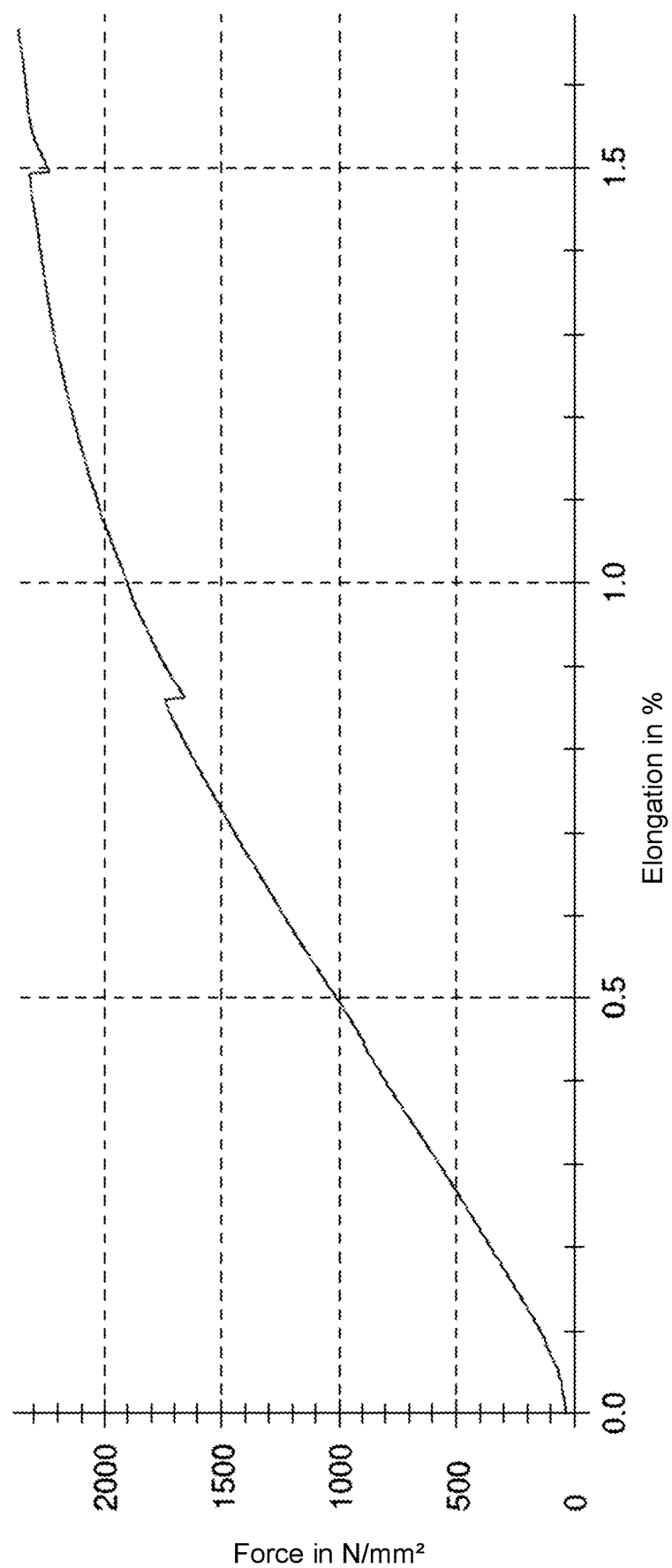
Figure 7:
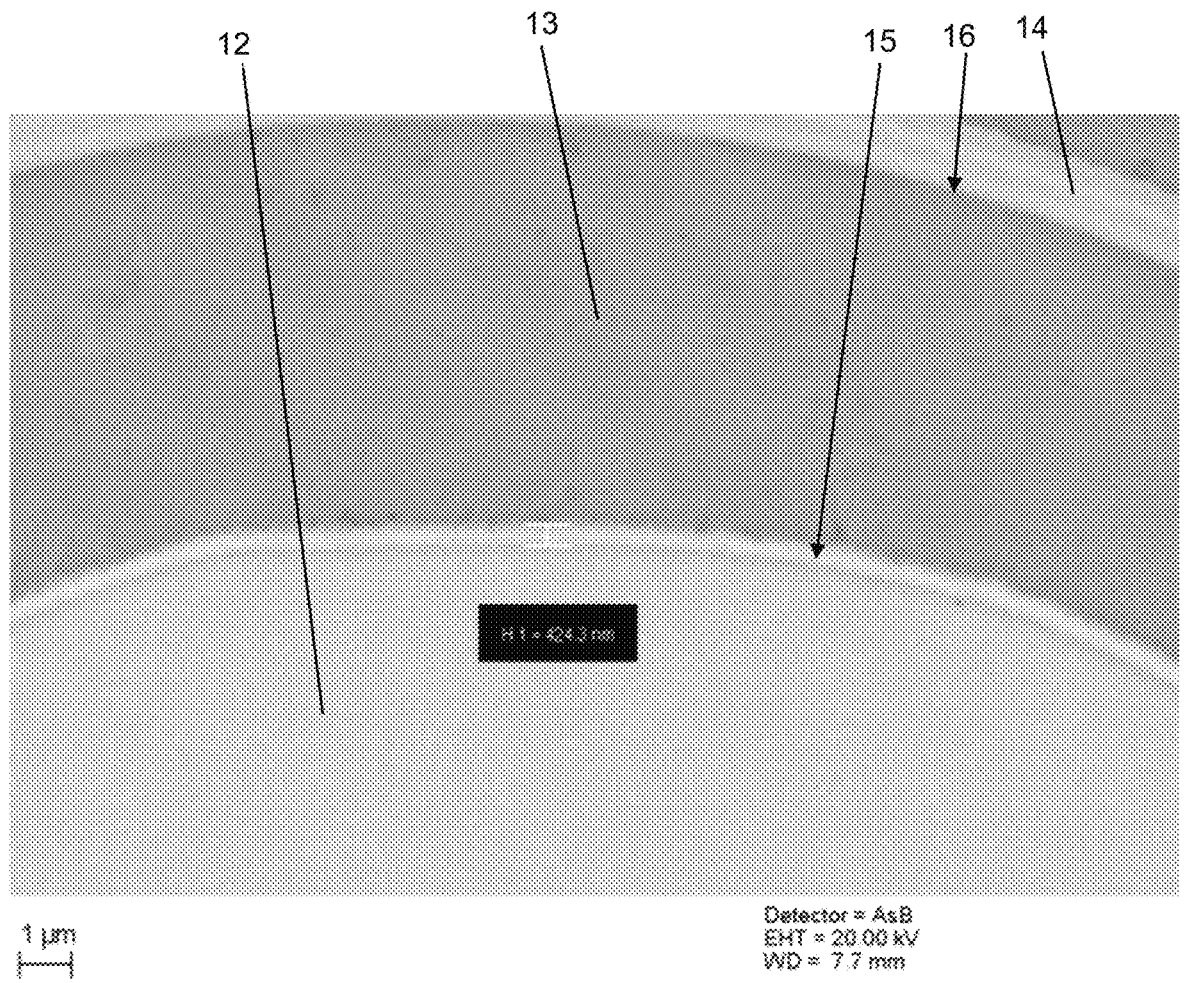
Figure 8:
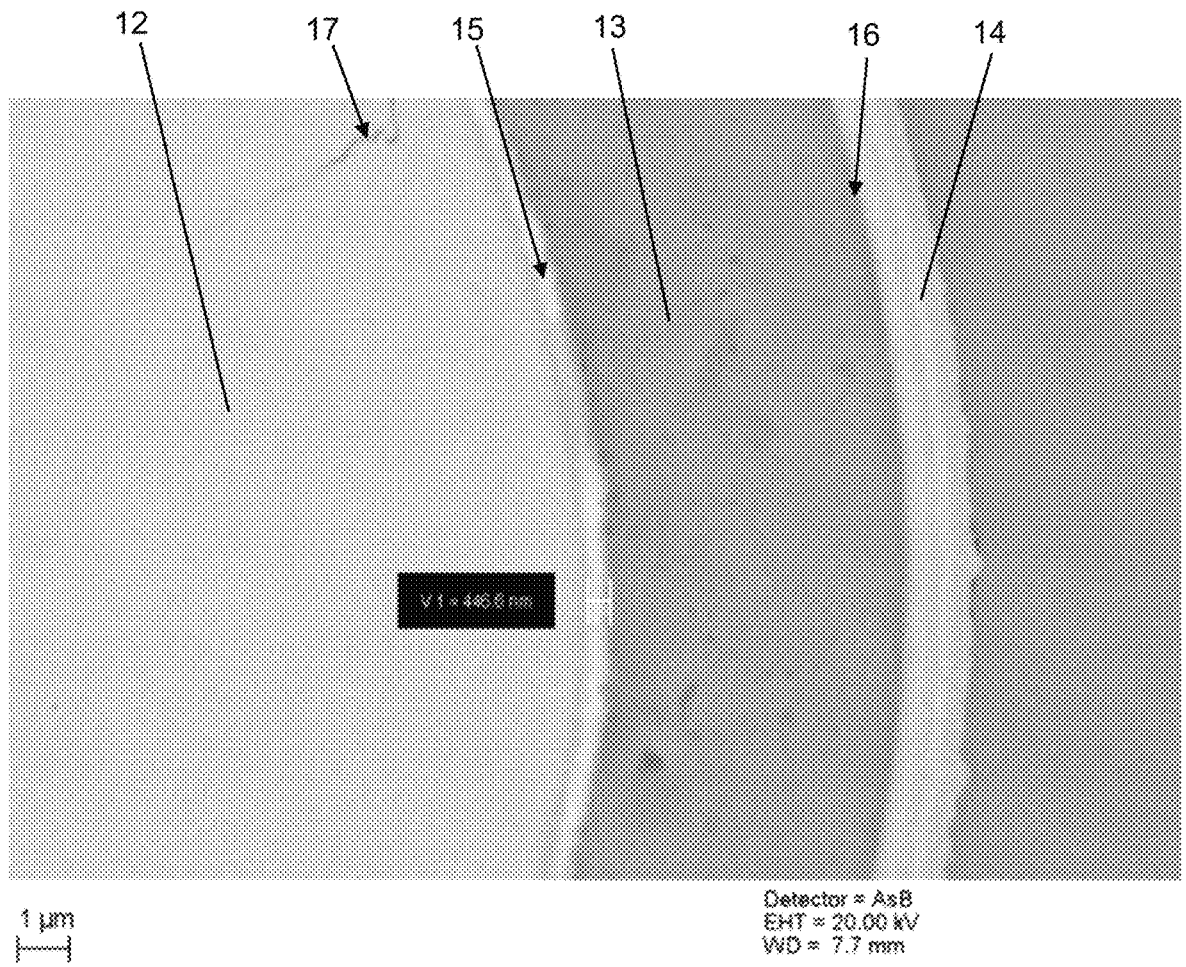
Figure 9:
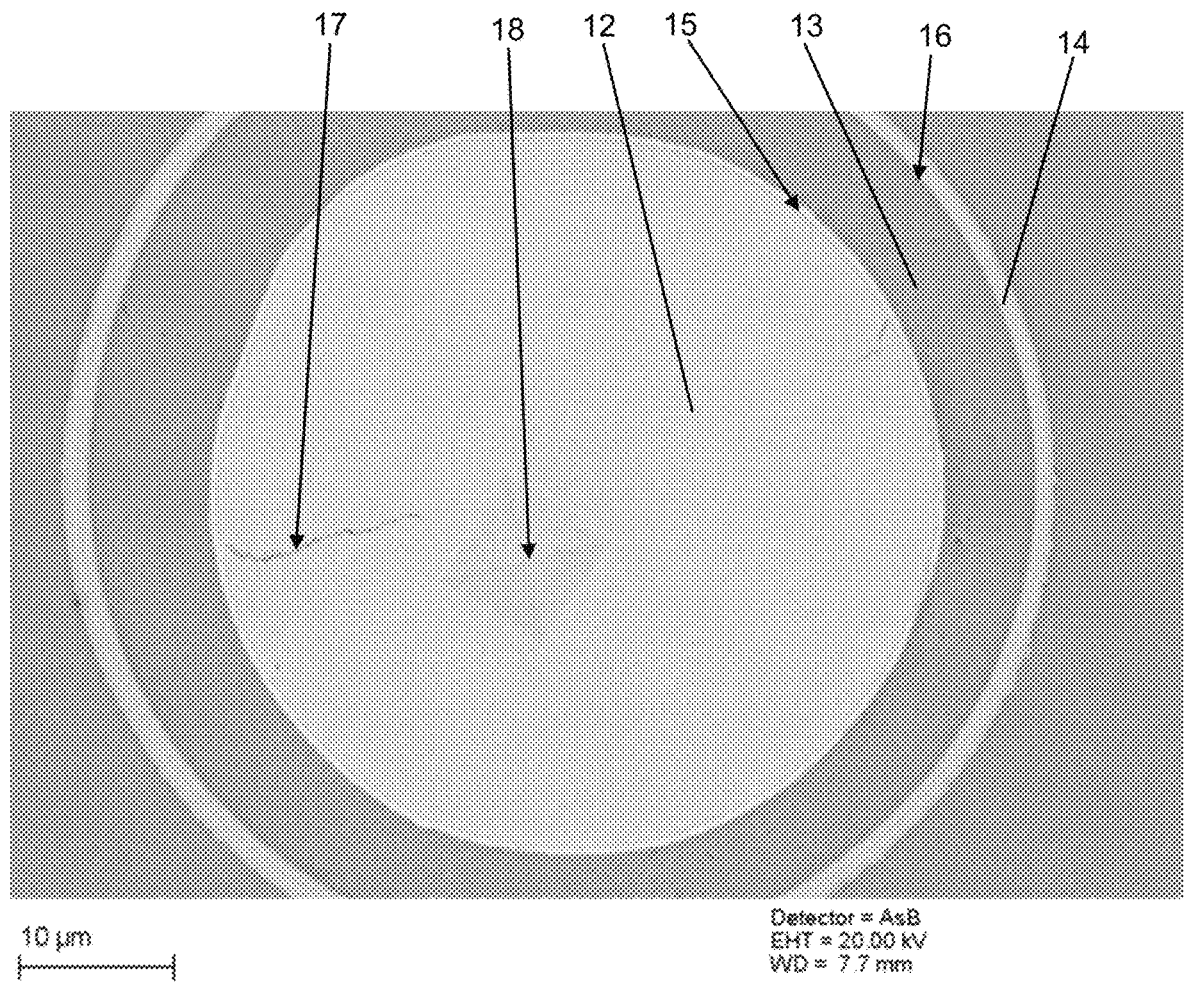
Figure 10:
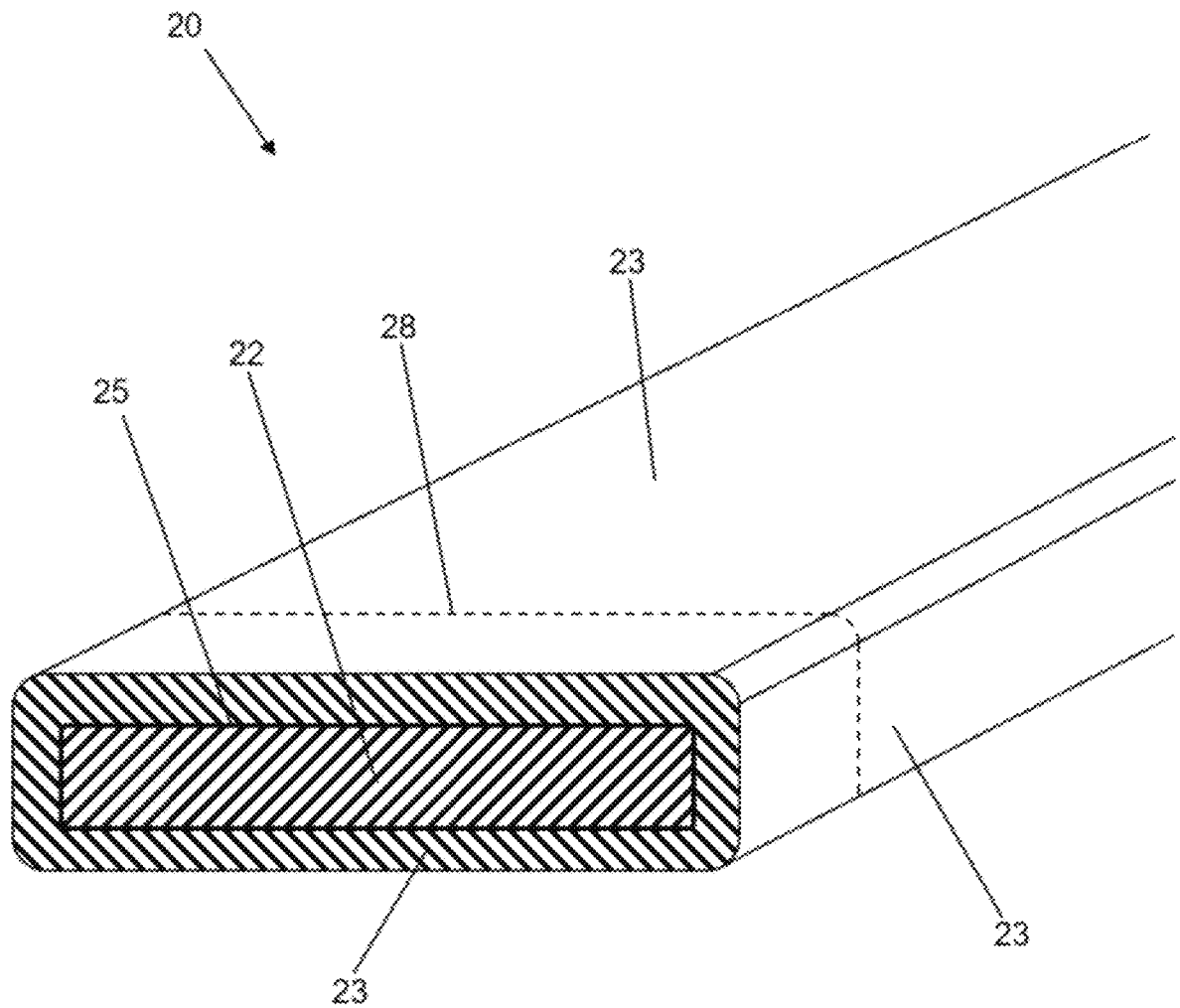
Figure 11:
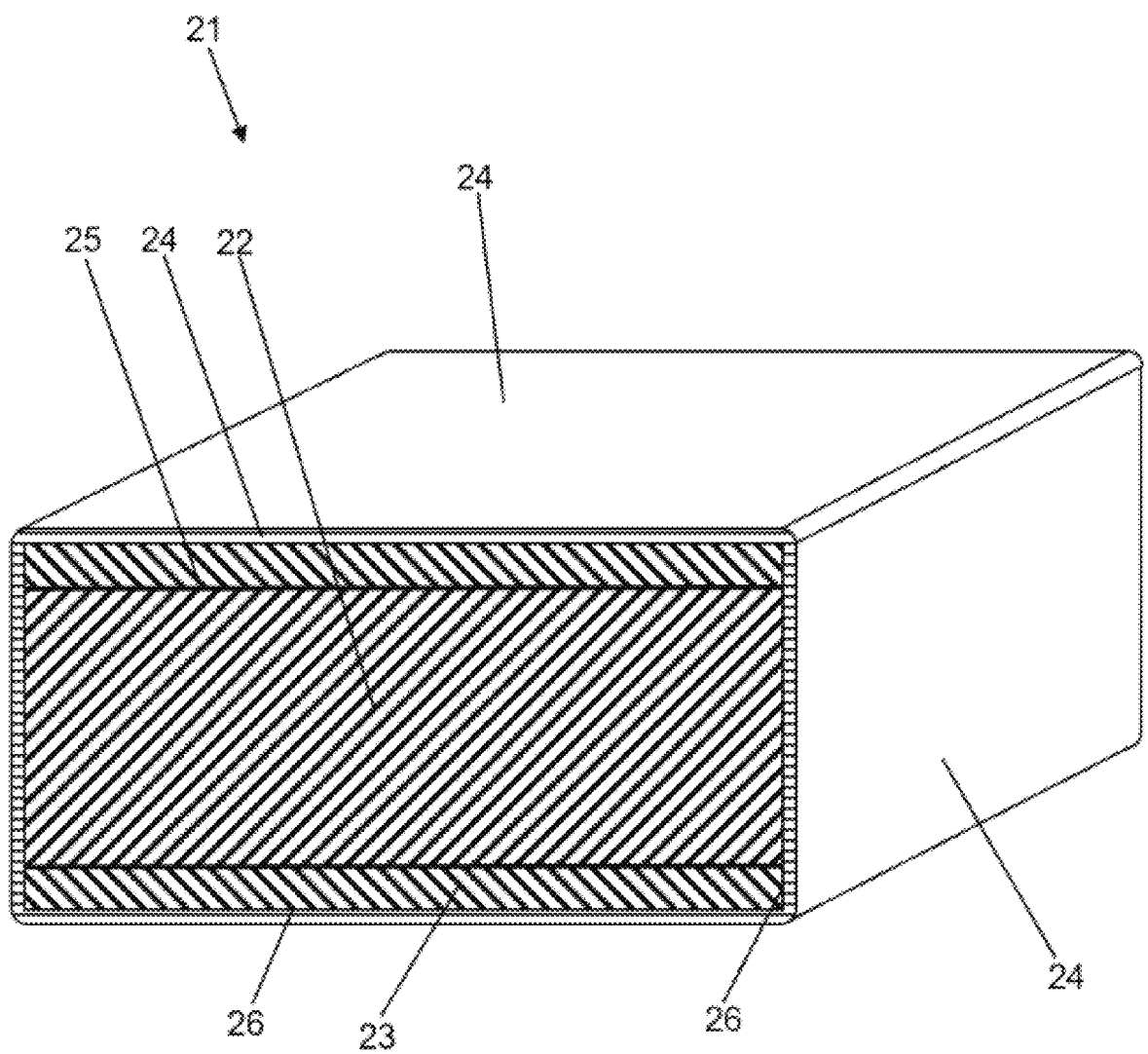
Figure 12:
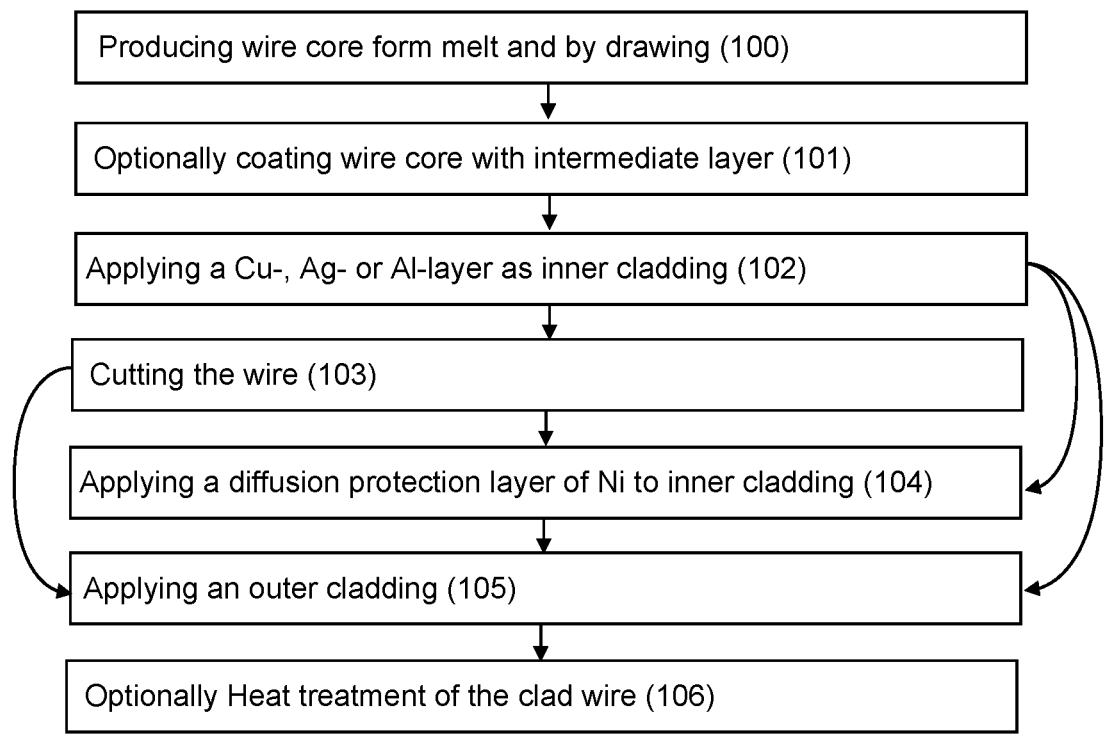

Exemplary embodiments of the invention are explained below on the basis of twelve figures without, however, limiting the invention. Therein:

FIG. 1: shows a schematic perspective cross-sectional view of a clad wire according to the invention;

FIG. 2: shows an image of a cross section through a clad wire according to the invention by a scanning electron microscope (SEM);

FIG. 3: shows a further image of a cross section through a clad wire according to the invention by an SEM;

FIG. 4: shows a further image of a cross section through a clad wire according to the invention by an SEM;

FIG. 5: shows a further image of a cross section through a clad wire according to the invention by an SEM;

FIG. 6: shows a force-elongation graph of a clad wire according to the invention;

FIG. 7: shows an image of a cross section through a clad wire according to the invention by an SEM with high magnification;

FIG. 8: shows a further image of a cross section through a clad wire according to the invention by an SEM with a high magnification;

FIG. 9: shows an image of a cross section through a clad wire according to the invention by an SEM with high magnification and with a crater from a hardness measurement;

FIG. 10: shows a schematic perspective cross-sectional view of an intermediate product for manufacturing a strip-like clad wire according to the invention from a coated strip;

FIG. 11: shows a schematic perspective cross-sectional view of a strip-like clad wire according to the invention produced from the intermediate product according to FIG. 10; and FIG. 12: shows the sequence of a method according to the invention in the form of a flow chart.

Figure 13:
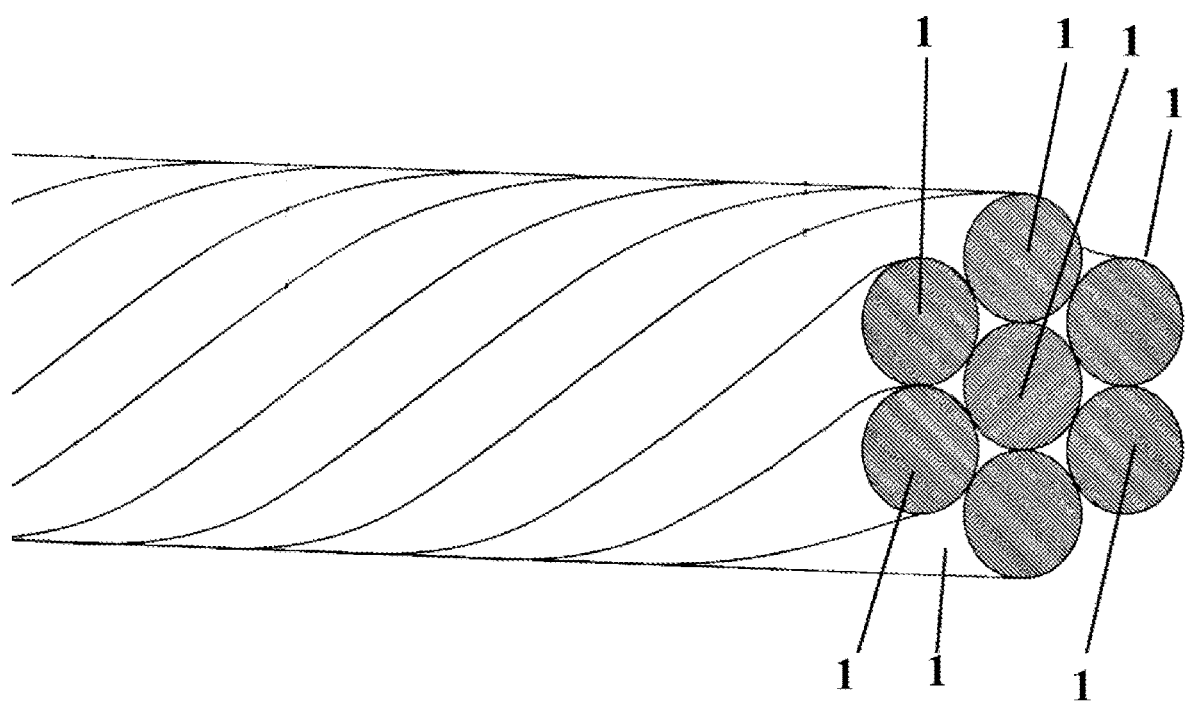

FIG. 13: shows a schematic illustration of an exemplary wire bundle according to the disclosure.

FIG. 1 shows a schematic perspective cross-sectional view of a clad wire 1 according to the invention with a cylindrically symmetrical structure. The clad wire 1 consists of a wire core 2 made of rhodium or a rhodium-based alloy, an inner cladding 3 made of copper or silver or aluminum or a copper-based alloy or a silver-based alloy or an aluminum-based alloy, an outer cladding 4 made of a metal or a metal alloy, and an adhesion-promoting layer 5 made of gold or a gold-based alloy. Optionally, a metallic diffusion protection layer 6 may be provided.

The wire core 2 extends in the innermost part of the clad wire 1. The inner cladding 3 encloses the wire core 2. The outer cladding 4 encloses the inner cladding 3 and consists of a metal or a metal alloy having a greater hardness than the material of the inner cladding 3, such as, for example, rhodium, a rhodium-based alloy, a copper-tin-zinc alloy, a palladium-nickel alloy or a gold-based alloy, wherein the gold-based alloy is preferably a gold-cobalt alloy, a gold-iron alloy or a gold-nickel alloy. The adhesion-promoting layer 5 is arranged between the wire core 2 and the inner cladding 3. The diffusion protection layer 6 can be arranged between the inner cladding 3 and the outer cladding 4 and prevent or impede the migration of atoms and ions from the outer cladding 4 into the inner cladding 3 so that they do not impair the electrical conductivity of the inner cladding 3.

The wire core 2 may have a diameter of about 40 μm, the inner cladding 3 may have a layer thickness of about 10 μm, and the outer cladding 4 may have a layer thickness of about 2 μm. The adhesion-promoting layer 5 and the diffusion protection layer 6 can be thinner than 1 μm.

In order to produce the clad wire 1, the wire core 2 can first be obtained from a melt by solidifying and then subsequently drawing the wire core 2 as a wire. The wire core 2 is preferably work-hardened in order to improve the mechanical properties of the wire core 2. The surface of the wire core 2 can then be cleaned before the following coating processes. However, the wire core 2 can also be produced using another method and be provided for further processing.

Subsequently, the adhesion-promoting layer 5 can be applied galvanically to the wire core 2. The inner cladding 3 can then be applied galvanically to the wire core 2 coated with the adhesion-promoting layer 5. This structure can then be galvanically coated with the diffusion protection layer 6. Finally, the outer cladding 4 can be applied galvanically to the diffusion protection layer 6 or directly to the inner cladding 3.

The clad wire 1 thus produced can optionally be after treated with a heat treatment. It is possible to wind the clad wire 1 as a long endless wire (at least 10 m) on a spool (not shown) to simplify later processing. Short pieces can be cut from the clad wire 1, which are then joined together as bundles in order to provide a wire bundle as a sliding contact. FIG. 13 shows a schematic illustration of an exemplary wire bundle according to the disclosure with a plurality of clad wires 1. Alternatively, a plurality of wire pieces of the clad wire 1 can also be arranged in a manner spaced apart from one another as arrays in order to form test needle arrays.

FIGS. 2 to 5 and 7 to 9 show images of cross sections of clad wires 11 according to the invention which were taken by a scanning electron microscope (SEM). The contrast arises in FIGS. 2 to 5 by backscattered electrons and in FIGS. 7 to 9 by secondary electrons.

The clad wires 11 have a wire core 12 made of a rhodium-zirconium alloy comprising 20 wt % of zirconium and 80 wt % of rhodium including common impurities. This alloy is also referred to as RhZr0.2. The rhodium-zirconium alloy is work-hardened by repeated forming. Because of the zirconium in the rhodium, the wire core 12 can be drawn particularly finely. The high tensile strength allows relatively thick copper layers to be applied to the wire core 12. Pure rhodium becomes brittle and can break at a diameter of between 80 μm and 100 μm or less.

An inner cladding 13 therefore consists of copper and an outer cladding 14 consists of a palladium-nickel alloy. The inner cladding 13 made of copper increases the electrical conductivity of the clad wire and, at the same time, improves the resilient properties of the clad wire 11. The outer cladding 14 is used to protect the copper of the inner cladding 13 from mechanical loads and wear effects. For this purpose, the outer cladding 14 is harder than the inner cladding 13. An adhesion-promoting layer 15 of gold is arranged between the wire core 12 and the inner cladding 13 in order to improve the mechanical connection of the inner cladding 13 to the wire core 12. The adhesion-promoting layer 15 thus improves the service life of the clad wire 11. Detachment of the copper from the rhodium-zirconium alloy of the wire core 12 can thus be prevented by the adhesion-promoting layer 15. A diffusion protection layer 16, which prevents palladium from diffusing into the copper of the inner cladding 13, can be provided between the inner cladding 13 and the outer cladding 14. This increases the service life of the clad wire 11 and the electrical conductivity of the clad wire 11 remains more constant over time. The diffusion protection layer 16 may also consist of a plurality of different diffusion barriers.

The wire cores 12 have a diameter of between 44 μm and 47 μm. The inner claddings 13 have a layer thickness of between 2.5 μm and 10 μm. The outer claddings 14 have a layer thickness of between 1.4 μm and 2 μm. The adhesion-promoting layers 15 have a layer thickness of between 420 nm and 470 nm. The relatively thick copper layer as an inner cladding 13 results in a strong increase in the electrical conductivity of the clad wire 11.

FIG. 6 shows a force-elongation graph of such a clad wire 11. The clad wire 11 withstands a force of about 1700 N per mm². The clad wire 11 had a diameter of 55 μm. A biasing force of 30 N/mm² was used. The speed in the flow region is 0.00025 s$^{-1}$.

The modulus of elasticity $m_E$, the 0.2% offset yield strength $Rp_{0.2}$ and the tensile strength $R_m$ are determined by means of a Zwick Z250 tensile testing machine. The tensile test was carried out on a clad wire with a wire diameter of 55 μm and relates thereto. The test speed with respect to the modulus of elasticity $m_E$ and the yield strength $Rp_{0.2}$ was 1 mm/min, while the test speed for the tensile strength $R_m$ was 10 mm/min.

The electrical conductivity was determined with a 4-pole measurement of the voltage drop across the test specimen for a defined length with a Burster Resistomat 2316. The measurement is carried out using a clad wire with a wire length of between 0.06 m and 0.07 m, a diameter of 52 µm and a measurement current of 10 mA.

The following mechanical properties for the clad wire 11 according to the invention arise from the experiments: $m_E$ 215.0 kN/mm², Rei 2240 MPa, $Rp_{0.2}$ 2171.8 N/mm², $R_m$ 2368.3 N/mm², $F_m$ 5.6 N, A 100 mm 0.53%. For the clad wire, 2171.8 MPa/215 GPa arises for the quotient $Rp_{0.2}/m_E$, which corresponds to a ratio of 0.0101. In comparison, the quotient $Rp_{0.2}/m_E$ for pure rhodium is 2300 MPa/370 GPa, which corresponds to a ratio of only 0.0062.

The greater the quotient $Rp_{0.2}/m_E$, the better the resilient properties in the elastic region.

Further experiments have shown that the resilient properties (quantifiable by the quotient $Rp_{0.2}/m_E$) of the clad wire 11 could be drastically improved (68% improvement compared to a wire of rhodium). Furthermore, the electrical conductivity (EC) could be increased by 79% in comparison with a wire made of rhodium.

|  | Rhodium | Clad wire |
|---|---|---|
| Modulus of elasticity $m_E$ | 370 GPa | 215 GPa |
| EC | 32% IACS | 57.5% IACS |
| $Rp_{0.2}$ | 2300 MPa | 2171.8 MPa |
| $Rp_{0.2}/m_E$ | 0.006 | 0.010 |

Table 1: Comparison of physical properties of the clad wire according to the invention in comparison with a wire made of rhodium The electrical conductivity (EC) is measured by means of 4-pole measurement for measuring the voltage drop across a test body of the rhodium wire or clad wire for a defined length. A BURSTER® Resistomat 2316 was used for measurement. The measurement is carried out at room temperature (22° C.).

A resistance of 1.00 ohm resulted for a length of 70 mm, a diameter of 52 µm and a cross-sectional area of 0.0021 mm² of a clad wire according to FIGS. 2 to 5 and 7 to 9. This results in a specific electrical resistance $R_{spec}$ of 0.030 ohm mm²/m and an electrical conductivity of 32.90 m/(ohm mm²) or 56.7% IACS. A resistance of 0.70 ohms resulted for a length of 50 mm, a diameter of 52 µm and a cross-sectional area of 0.0021 mm² of a clad wire according to FIGS. 2 to 5 and 7 to 9. This results in a specific electrical resistance $R_{spec}$ of 0.030 ohm mm²/m and an electrical conductivity of 33.73 m/(ohm mm²) or 58.2% IACS. 100% IACS corresponds to 58 m/(ohm mm²).

Alternatively to the clad wire 1 shown in FIG. 1, a strip-like wire core 22 can also be used to produce a clad wire 21, as shown in FIG. 11.

FIG. 10 shows a schematic perspective cross-sectional view of an intermediate product 20 for producing a strip-like clad wire 21 according to the invention. FIGS. 10 and 11 show the manufacture of a strip-like clad wire 21 via the intermediate product 20 shown in FIG. 10. FIG. 11 shows a schematic perspective cross-sectional view of the clad wire 21 according to the invention. The clad wire 21 consists of a wire core 22 made of rhodium or a rhodium-based alloy, an inner cladding 23 made of copper or silver or aluminum or a copper-based alloy or a silver-based alloy or an aluminum-based alloy, an outer cladding 24 made of a metal or a metal alloy, and an adhesion-promoting layer 25 made of gold or a gold-based alloy. Optionally, a metallic diffusion protection layer 26 may be provided between the inner cladding 23 and the outer cladding 24.

The strip-like wire core 22 initially has a rectangular cross section, as shown in FIG. 10. This strip-like wire core 22 is coated with the adhesion-promoting layer 25 and the inner cladding 23. Subsequently, the thus coated wire core 22, i.e. the intermediate product 20, is cut perpendicular to a longitudinal direction of the strip-like wire core 22 (into the image plane in FIG. 10) into many pieces. One of the sectional planes is indicated in FIG. 10 by a dashed line as a sectional plane 28. The cut pieces of the coated wire core 22 are coated on two opposite sides with the adhesion-promoting layer 25 and the inner cladding 23. These pieces are then galvanically coated with the diffusion protection layer 26 and then with the outer cladding 24 or coated only with the outer cladding 24. As a result, the clad wire 21 is obtained as shown in FIG. 11.

The wire core 22 extends in the innermost part of the clad wire 21. The inner cladding 23 covers the wire core 22 on two opposite sides. The outer cladding 24 encloses the inner cladding 23 and the wire core 22 and consists of a metal or a metal alloy having a greater hardness than the material of the inner cladding 23, such as, for example, rhodium, a rhodium-based alloy, a copper-tin-zinc alloy, a palladium-nickel alloy or a gold-based alloy, wherein the gold-based alloy preferably is a gold-cobalt alloy, a gold-iron alloy or a gold-nickel alloy. The adhesion-promoting layer 25 is arranged between the wire core 22 and the inner cladding 23. The diffusion protection layer 26 may be arranged between the outer cladding 24 and the inner cladding 23 and also between the outer cladding 24 and the wire core 22 and prevent or impede the migration of atoms and ions from the outer cladding 24 into the inner cladding 23 so as not to impair the electrical conductivity of the inner cladding 23.

The wire core 22 may have a width of about 100 µm and a thickness of about 30 µm, the inner cladding 23 may have a layer thickness of about 10 µm, and the outer cladding 24 may have a layer thickness of about 2 µm. The adhesion-promoting layer 25 and the diffusion protection layer 26 may be thinner than 1 µm.

In order to produce the clad wire 21, the strip-like wire core 22 can first be obtained from a melt by solidifying and subsequently drawing and rolling of the wire core 22 as a strip. The wire core 22 is preferably work-hardened in order to improve the mechanical properties of the wire core 22. The surface of the wire core 22 can then be cleaned before the following coating processes. However, the wire core 22 can also be produced by another method and be provided for further processing.

Subsequently, the adhesion-promoting layer 25 can be applied galvanically to the strip-like wire core 22. Thereafter, the inner cladding 23 can be galvanically applied to the wire core 22 coated with the adhesion-promoting layer 25 in order to obtain the intermediate product 20. After cutting the intermediate product 20, the cut pieces may be galvanically coated with the diffusion protection layer 26. Finally, the outer cladding 24 can be applied galvanically to the diffusion protection layer 26 or directly to the inner cladding 23 or the wire core 22.

The strip-like clad wire 21 produced in this way can optionally be after treated with a heat treatment. From the clad wire 21, a plurality of strip-like wire pieces of the clad wire 21 can also be arranged as arrays in a manner spaced apart from one another in order to form test needle arrays.

The sequence of a method according to the invention is depicted below by means of FIG. 12 together with FIGS. 10, 11 and FIG. 1.

In a first work step 100, the wire core 2, 22 can be produced from the melt and by drawing. An RhZr0.2 alloy can be used as the material for the wire core. The wire core 2, 22 can be work-hardened in order to improve the mechanical properties, in particular the resilient properties of the clad wire to be produced. The surface of the wire core 2, 22 can be cleaned before the further processing.

In a second work step 101, the wire core 2, 22 can be galvanically coated with a thin gold layer as an adhesion-promoting layer 5, 25.

In a third work step 102, a copper layer or a silver layer or an aluminum layer can be applied galvanically to the wire core 2, 22 coated with the adhesion-promoting layer 5, 25 as an inner cladding 3, 23.

In an optional fourth work step 103, the intermediate product 20, i.e. the coated strip-like wire core 22, can be cut perpendicular to the longitudinal axis of the strip-like wire core into pieces, as indicated by the dashed line in FIG. 10 as the sectional plane 28.

In an optional fifth work step 104, a diffusion protection layer 6, 26 of nickel can be applied to the inner cladding 3, 23 and optionally also to open surfaces of the wire core 22.

In a sixth work step 105, a layer of rhodium, a rhodium-based alloy, a gold-based alloy, a gold-cobalt alloy, a gold-iron alloy, a gold-nickel alloy, a copper-tin-zinc alloy or a palladium-nickel alloy as an outer cladding 4, 24 can be galvanically applied to the inner cladding 3, 23 and optionally also to open surfaces of the wire core 22 or to the diffusion protection layer 6, 26.

Subsequently, a heat treatment of the clad wire 1, 21 produced in this way can optionally be carried out in a seventh work step 106.

The features of the invention disclosed in the preceding description, as well as in the claims, figures and exemplary embodiments can be essential both individually and in any combination for realizing the invention in its various embodiments.

LIST OF REFERENCE NUMERALS 1, 11, 21 Clad wire
2, 12, 22 Wire core
3, 13, 23 Inner cladding
4, 14, 24 Outer cladding
5, 15, 25 Adhesion-promoting layer
6, 16, 26 Diffusion protection layer
20 Intermediate product
28 Sectional plane
100 First work step
101 Second work step
102 Third work step
103 Fourth work step
104 Fifth work step
105 Sixth work step
106 Seventh work step

What is claimed is:

1. A clad wire for producing a test needle or a sliding contact, the clad wire comprising:
a wire core made of rhodium or a rhodium-based alloy,
an inner cladding made of copper, silver, aluminum, a copper-based alloy, a silver-based alloy or an aluminum-based alloy, wherein the inner cladding covers the wire core on at least two opposite sides or completely encloses the wire core,
an adhesion-promoting layer made of gold or a gold-based alloy, which is arranged between the wire core and the inner cladding, and
an outer cladding made of a metal or a metal alloy having a greater hardness than the material of the inner cladding,
wherein
the outer cladding encloses the inner cladding, and
the outer cladding is the outermost layer of the clad wire.

2. The clad wire of claim 1, wherein
the volume of the wire core is at least as large as the volume of the inner cladding, and/or
the wire core and the inner cladding have a thickness or a layer thickness at least twice as large as the adhesion-promoting layer.

3. The clad wire of claim 1, further comprising:
a diffusion protection layer arranged as a diffusion barrier between the inner cladding and the outer cladding.

4. The clad wire of claim 3, wherein
the inner cladding has a layer thickness at least twice as large as the diffusion protection layer.

5. The clad wire of claim 1, wherein
the outer cladding consists of rhodium, a rhodium-based alloy, a copper-tin-zinc alloy, a palladium-nickel alloy or a gold-based alloy.

6. The clad wire of claim 1, wherein
the clad wire at room temperature has a modulus of elasticity (mE) of at least 150 GPa, and/or
the clad wire at room temperature has a 0.2% offset yield strength Rp0.2 (elasticity limit) of at least 1800 MPa, and/or
the clad wire at room temperature has an electrical conductivity of at least 40% IACS.

7. The clad wire of claim 1, wherein
the clad wire has a diameter or a thickness of at most 200 μm.

8. The clad wire of claim 1, wherein
the wire core has a diameter or a thickness of between 9 μm and 100 μm, and/or
the inner cladding has a layer thickness of between 1 μm and 20 μm, and/or
the outer cladding has a layer thickness of between 0.5 μm and 5 μm, and/or
the adhesion-promoting layer has a layer thickness of between 100 nm and 1000 nm.

9. The clad wire of claim 1, wherein
the adhesion-promoting layer, the inner cladding, the outer cladding and optionally the diffusion protection layer are galvanic coatings.

10. The clad wire of claim 1, wherein
the wire core is work-hardened, and/or
the wire core is a coated strip.

11. A method for producing a clad wire according to claim 1, the method comprising the following chronological steps:
A) providing the wire core made of rhodium or a rhodium-based alloy,
B) coating the wire core with the adhesion-promoting layer made of gold or a gold-based alloy,
C) coating the wire core, coated with the adhesion-promoting layer, with the inner cladding of copper, silver, aluminum, a copper-based alloy, a silver-based alloy or an aluminum-based alloy, and D) coating the wire core, coated with the adhesion-promoting layer and the inner cladding, with the outer cladding made of a metal or a metal alloy with a greater hardness than the material of the inner cladding, wherein the outer cladding is the outermost layer of the produced clad wire.

12. The method of claim 11, wherein the coatings according to steps B), C) and D) are applied using a galvanic method and/or are applied using a physical method.

13. A test needle comprising at least one clad wire according to claim 1.

14. A test needle array having a plurality of test needles according to claim 13 spaced apart from one another.

15. The test needle of claim 13, wherein the test needle is bent perpendicular to a longitudinal axis of the at least one clad wire.

16. A sliding contact comprising a plurality of clad wires according to claim 1.

17. The sliding contact of claim 16, wherein the plurality of clad wires is in the form of a wire bundle.

18. A method for producing a clad wire comprising the following chronological steps:
   A) providing a strip-like wire core made of rhodium or a rhodium-based alloy,
   B) coating the wire core with an adhesion-promoting layer made of gold or a gold-based alloy to form an adhesion-promoting layer-coated wire core,
   C) coating the adhesion-promoting layer-coated wire core with an inner cladding to form an inner cladding/adhesion-promoting layer-coated wire core, the inner cladding made of copper, silver, aluminum, a copper-based alloy, a silver-based alloy or an aluminum-based alloy,
   D) cutting the inner cladding/adhesion-promoting layer-coated wire core perpendicular to a longitudinal axis thereof to form a plurality of inner cladding/adhesion-promoting layer-coated wire cores, and
   E) coating each of the plurality of inner cladding/adhesion-promoting layer-coated wire cores with an outer cladding to form a plurality of outer cladding/inner cladding/adhesion-promoting layer-coated wire cores, the outer cladding made of a metal or a metal alloy with a hardness greater than a hardness of the material of the inner cladding, wherein the outer cladding is the outermost layer of the produced outer cladding/inner cladding/adhesion-promoting layer-coated wire cores.

19. The method of claim 18, wherein the outer cladding/inner cladding/adhesion-promoting layer-coated wire cores
   have a modulus of elasticity (mE) of at least 150 GPa at room temperature, and/or have a 0.2% offset yield strength Rp0.2 (elasticity limit) of at least 1800 MPa at room temperature, and/or
   have an electrical conductivity of at least 40% IACS at room temperature.

* * * * *